(12) United States Patent
Khasnis et al.

(10) Patent No.: US 9,584,077 B2
(45) Date of Patent: Feb. 28, 2017

(54) IMPEDANCE SYNTHESIS FOR OPTIMUM FREQUENCY RESPONSE OF A RADIO FREQUENCY (RF) AMPLIFIER

(71) Applicant: SIGNALCHIP INNOVATIONS PRIVATE LIMITED, Bangalore (IN)

(72) Inventors: Himamshu Gopalakrishna Khasnis, Bangalore (IN); Naveen Mahadev, Bangalore (IN)

(*) Notice: Subject to any disclaimer, the term of this patent is extended or adjusted under 35 U.S.C. 154(b) by 0 days.

(21) Appl. No.: 14/876,577

(22) Filed: Oct. 6, 2015

(65) Prior Publication Data
US 2016/0344354 A1    Nov. 24, 2016

(30) Foreign Application Priority Data

May 22, 2015 (IN) .......................... 2577/CHE/2015

(51) Int. Cl.
| | |
|---|---|
| *H04B 1/10* | (2006.01) |
| *H03F 3/19* | (2006.01) |
| *H03F 3/21* | (2006.01) |
| *H04L 25/08* | (2006.01) |

(52) U.S. Cl.
CPC ............. *H03F 3/19* (2013.01); *H03F 3/21* (2013.01); *H04L 25/08* (2013.01); *H03F 2200/294* (2013.01); *H03F 2200/451* (2013.01)

(58) Field of Classification Search
CPC .................................................. H04B 7/0848
USPC ...................................................... 375/350
See application file for complete search history.

(56) References Cited

U.S. PATENT DOCUMENTS

| | | | | |
|---|---|---|---|---|
| 5,341,142 A | * | 8/1994 | Reis ..................... | F41G 7/2226 244/3.15 |
| 5,440,503 A | * | 8/1995 | Maruyama ......... | H03H 17/0657 341/143 |
| 6,407,634 B1 | * | 6/2002 | Staudinger ............... | H03F 1/34 330/10 |
| 7,809,349 B1 | * | 10/2010 | Granger-Jones ......... | H04B 1/28 455/307 |
| 2008/0214135 A1 | * | 9/2008 | Muhammad ............. | H04B 1/18 455/296 |
| 2012/0327000 A1 | * | 12/2012 | Oh ......................... | G06F 3/0416 345/173 |

* cited by examiner

*Primary Examiner* — Lihong Yu
(74) *Attorney, Agent, or Firm* — The Law Office of Austin Bonderer, PC; Austin Bonderer

(57) ABSTRACT

A method and system of synthesizing impedance in a radio frequency (RF) amplifier includes receiving a voltage signal at a passive mixer. The passive mixer down-converts the voltage signal into a baseband frequency. The method includes converting the voltage signal into a digital signal. Further, the method includes performing convolution of the digital signal with an impulse response. The impulse response is of a low Q impedance and is programmable. Furthermore the method includes generating a current signal based on output of the convolution. Furthermore the method includes performing up-conversion of the current signal in the passive mixer. The passive mixer performs impedance transformation of the low Q impedance. Moreover, the method includes providing the current signal via the passive mixer to synthesize desired impedance in the RF amplifier, thereby controlling frequency response of the RF amplifier.

15 Claims, 5 Drawing Sheets

IMPEDANCE SYNTHESIS FOR OPTIMUM FREQUENCY RESPONSE OF A RADIO FREQUENCY (RF) AMPLIFIER

PRIORITY APPLICATION

This application claims priority from an Indian Non-provisional Patent Application No. 2577/CHE/2015 filed on May 22, 2015, which is incorporated in its entirety herewith.

FIELD OF THE INVENTION

The present invention relates to the field of impedance synthesis and more specifically to synthesizing impedance in a Radio Frequency (RF) amplifier to alter frequency response of the RF amplifier.

BACKGROUND

Recent years have witnessed the advent of Radio Frequency (RF) circuits requiring filters with High Q factors and sharp stop bands. Existing systems are capable of providing filters with High Q factors and stop bands to RF circuits.

One existing system employs SAW filters to provide filters with High Q factor in the RF circuits. SAW filters are filters with high Q factors and sharp stopbands. However, use of the SAW filter in RF circuits is associated with several drawbacks. Firstly, the SAW filters are too bulky to be realized on-chip. As a result, the SAW filters are implemented externally. The SAW filters increase the size and cost of the RF circuits. Further, insertion loss of the SAW filters adds to the noise figure of the RF circuits. Moreover, impulse response, filter bandwidth and center frequency of the SAW filter lack programmability. As a result, the RF circuits require a different SAW filter for every frequency, band and mode of operation. Moreover, the drawbacks of the SAW filter make the RF circuit bulky and expensive. As a result, there is a need for a low cost on-chip system capable of providing function of a High Q filter in a RF circuit. Existing systems employ a plurality of methods to simulate functioning of the High Q filter in an RF circuit.

In another existing system, an RF circuit uses mixers, notch filters, amplifiers, and signal subtractors to simulate a filter in the RF circuit. In an example, a mixer in the RF circuit converts an RF signal at radio frequency to an IF signal at Baseband frequency. Further, system feeds the IF signal simultaneously into a first path and a second path. The first path includes a first amplifier. The IF signal fed into the first path is a first signal. The first amplifier amplifies the first signal. The second path includes a notch filter and a second amplifier. The IF signal fed into the second path is a second signal. The notch filter allows undesired frequency bands of the second signal to pass through and attenuates desired frequency bands of the second signal. Further, the second amplifier amplifies the second signal. A signal subtractor subtracts the second signal from the first signal. As a result, output of the signal subtractor lacks the undesired frequency bands. In effect, the system frequency translates the low Q baseband filter to a high Q notch filter. However, the system has several disadvantages. Impulse response of the notch filter lacks programmability. Further, use of the signal subtractor, the first amplifier, and the second amplifier adds to the noise figure of the system.

In yet another existing system, an RF circuit uses the impedance transformation property of passive mixers to generate a High Q band pass filter from a low Q baseband impedance. Center frequencies of the high Q band pass filters are governed by frequency of a local oscillator fed into the passive mixer. The system generates the high Q filter using a passive mixer based on switches and a low Q baseband impedance. In an example, the low Q baseband impedance are capacitors. However, impulse response of the High Q filters generated lack programmability.

One solution to problems displayed by existing systems is synthesizing impedance in an RF amplifier in the RF circuit thereby altering frequency response of the RF amplifier to frequency response of a High Q band pass filter.

In light of the foregoing discussion, there is a need for a system to synthesize a High Q impedance in an RF amplifier and thereby altering frequency response of the RF amplifier to frequency response of a High Q band pass filter. It is desired that the system enables synthesis of high Q impedance in the RF amplifier via impedance transformation of low Q baseband impedance. Moreover, it is desired that the synthesized high Q impedance in the RF amplifier is programmable. Further, it is desired that the central frequency of frequency response of the RF amplifier is programmable. It is desired that the impulse response of the high Q impedance filter is programmable. It is also desired that any type of filter be incorporated into the RF amplifier through impedance transformation.

SUMMARY

The above mentioned needs are met by a method and system for synthesizing impedance in an RF amplifier.

An example of a method of synthesizing impedance in a radio frequency (RF) amplifier includes receiving a voltage signal at a passive mixer. The passive mixer down-converts the voltage signal into a baseband frequency. The method includes converting the voltage signal into a digital signal. Further, the method includes performing convolution of the digital signal with an impulse response. The impulse response is of a low Q impedance and is programmable. Furthermore the method includes generating a current signal based on output of the convolution. Furthermore the method includes performing up-conversion of the current signal in the passive mixer. The passive mixer performs impedance transformation of the low Q impedance. Moreover, the method includes providing the current signal via the passive mixer to synthesize desired impedance in the RF amplifier, thereby controlling frequency response of the RF amplifier.

An example of a system of synthesizing impedance in a radio frequency (RF) amplifier includes an analogue to digital converter to convert a voltage signal into a digital signal. Further, the system comprises a digital filter to perform convolution of the digital signal with an impulse response. The impulse response is of a low Q impedance and is programmable. Furthermore, the system includes a digital to analogue converter to generate a current signal based on output of the convolution. The system includes a passive mixer to receive the voltage signal. The passive mixer performs down-conversion of the voltage signal into a baseband frequency. Further, the passive mixer performs up-conversion of the current signal. Moreover, the passive mixer provides the current signal via the passive mixer to synthesize desired impedance in the RF amplifier, thereby controlling frequency response of the RF amplifier.

An example of a system of synthesizing impedance in a radio frequency (RF) amplifier includes an analogue to digital converter to convert a voltage signal into a digital signal. Further, the system comprises a digital filter to perform convolution of the digital signal with an impulse response. The impulse response is of a low Q impedance and is programmable. Furthermore, the system includes a digital to analogue converter to generate a current signal based on output of the convolution. The system includes a passive mixer to receive the voltage signal. The passive mixer performs down-conversion of the voltage signal into a baseband frequency. Further, the passive mixer performs up-conversion of the current signal. Moreover, the passive mixer provides the voltage signal via the passive mixer to synthesize desired impedance in the RF amplifier, thereby controlling frequency response of the RF amplifier. Further, the system includes an image rejecting filter to attenuate image frequency components from the current signal.

An example of a system for synthesizing impedance in a radio frequency (RF) amplifier includes a passive mixer. The passive mixer is operable to receive a current signal, and perform down-conversion of the current signal into a baseband frequency. Further, the system includes an analogue to digital converter to convert the current signal into a digital signal. Furthermore, the system includes an analogue filter to attenuate undesirable signal components in the current signal. Moreover, a digital filter to perform convolution of the digital signal with an impulse response. The impulse response is of a baseband impedance and is programmable. Further, the system includes an instantaneous response element to provide an approximation of the impulse response to the current signal. The instantaneous response element is a passive component. Moreover, the system includes a digital to analogue converter to generate a voltage signal based on output of the convolution.

The features and advantages described in this summary and in the following detailed description are not all-inclusive, and particularly, many additional features and advantages will be apparent to one of ordinary skill in the relevant art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF FIGURES

In the following drawings like reference numbers are used to refer to like elements. Although the following figures depict various examples of the invention, the invention is not limited to the examples depicted in the figures.

DESCRIPTION

In the present disclosure, relational terms such as first and second, and the like, may be used to distinguish one entity from the other, without necessarily implying any actual relationship or order between such entities. The following detailed description is intended to provide example implementations to one of ordinary skill in the art, and is not intended to limit the invention to the explicit disclosure, as one or ordinary skill in the art will understand that variations can be substituted that are within the scope of the invention as described.

Embodiments of the present disclosure described herein disclose a method and system for synthesizing impedance in a Radio Frequency amplifier. The present invention alters frequency response of the RF amplifier into frequency response of a High Q impedance filter. The high Q impedance filter is synthesized from low Q baseband impedance using the impedance transformation property of a passive mixer. The present invention enables the center frequency of frequency response of the high Q impedance to be programmed. Moreover, the present invention allows digital synthesis of a High Q impedances in the RF amplifier. The various methods and embodiments for synthesizing impedance in a Radio Frequency (RF) amplifier are explained in detail in conjunction with the description of FIGS. 2 to 5.

Figure 1:
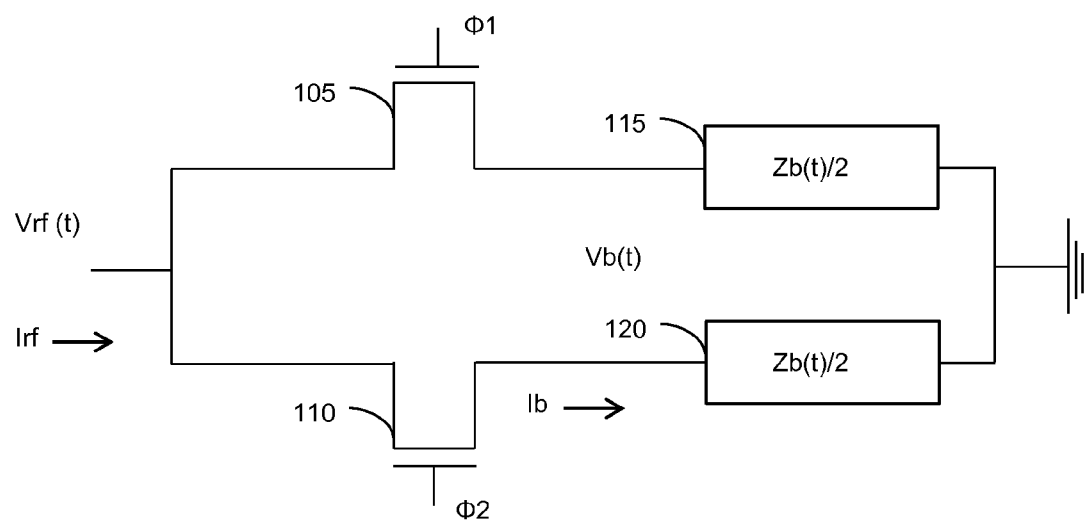
FIG. 1 is a block diagram of a system for performing impedance transformation with a passive mixer in accordance with a prior art.

FIG. 1 is a block diagram of a system for performing impedance transformation with a passive mixer in accordance with a prior art. The system includes a first baseband impedance 115 whose impulse response is Zb(t)/2, and a second baseband impedance 120 with impulse response Zb(t)/2. Further, the system includes a first switch 105, and a second switch 110. The first switch 105 and the second switch 110 function together as a passive mixer. Examples of the first switch 105 and the second switch 110 includes but is not limited to MOS switches and CMOS switches. Gates of the first switch 105 and the second switch 110 are clocked by square wave signals from a local oscillator. The square wave signals fed to the gates of the first switch 105 and the second switch 110 are 180 degrees out of phase with each other. The passive mixer converts signals in Radio frequency to baseband signals. Vrf (t) is voltage at the RF side of the system. Vb (t) is the voltage in the baseband side of the system. Irf (t) is the current in the RF side of the system.

The first switch 105 and the second switch 110 commutes the current Irf (t) into the first baseband impedance 115 and the second baseband impedance 120. Further, the first switch 105 and the second switch 110 down-converts the signal at RF frequency to a baseband frequency. Action of the first switch 105 and the second switch 110 results in the current Ib (t). Ib (t) is a down-converted version of Irf (t). The local oscillator generates a clock signal c (t). The local oscillator operates at a frequency of $\omega_{LO}$. The current Ib(t) is the product of the current Irf (t) and a clock signal c(t):

$$Ib(t) = Irf(t) \cdot c(t) \quad (1)$$

After down conversion, the Irf (t) splits into different currents. Further, the generated currents have higher order harmonics at frequencies $3\omega_{Lo}$ and $5\omega_{Lo}$. However, the higher order harmonics are ignored because of the baseband nature of the first baseband impedance 115 and the second baseband impedance 120. The fundamental components of Ib(t) are:

$$Ib(t) = \pm(2/\Pi) \times Irf(t) \times \cos(\omega lo \times t) \quad (2)$$

The first baseband impedance 115 and the second baseband impedance 120 are assumed to be Linear Time Invariant systems. As a result, baseband voltage Vb (t) is convolution integral of the current Ib (t) and baseband impedance Zb (t). Replacing Ib(t) with equation (2), the following equation is obtained:

$$Vb(t)=\{\pm(2/\Pi)\times Irf(t)\times\cos(\omega lo\times t)\}*Zb(t) \quad (3)$$

The first switch 105 and the second switch 110 act as the passive mixer and performs an up-conversion of the baseband voltage Vb(t) to the Vrf(t). Further, voltage drops across the first switch 105 and the second switch 110 adds to the Vrf(t). Rsw is the resistance across the first switch 105 and the second switch 110. As a result, the value of Vrf(t) is calculated by the following equation:

$$V_{rf}(t) = \quad (4)$$
$$R_{sw} \times I_{rf}(t) + \left\{ \left( \frac{8}{\Pi^2} \right) \times \cos(\omega_{lo} \times t) \times (\{I_{rf}(t) \times \cos(\omega_{lo} \times t)\} * Z_b(t) \right\}$$

Laplace transform converts equation (4) into the following equation.

$$V_{rf}(s) = R_{sw} \times I_{rf}(s) + \left( \frac{2}{\Pi^2} \right) [I_{rf}(s)Z_b(s+j\omega_{LO}) + I_{rf}(s)Z_b(s-j\omega_{LO}) + \quad (5)$$
$$I_{rf}(s+2j\omega_{LO})Z_b(s+2j\omega_{LO}) + I_{rf}(s-2j\omega_{LO})Z_b(s-2j\omega_{LO})]$$

Rearranging and omitting terms other than the terms signifying frequency of the local oscillator, $\omega_{Lo}$, we obtain the following equation:

$$\frac{V_{rf}(s)}{Irf(s)} = R_{sw} + \left( \frac{1}{\Pi^2} \right) \{Z_b(s-j\omega_{LO}) + Z_b(s+j\omega_{LO})\} \quad (6)$$

The term Vrf(s)/Irf(s) is the input impedance of the system. According to equation (6), the input impedance of the system is sum of switch resistance RSW and a band pass impedance. The band pass impedance is created by scaling and frequency shifting the baseband impedance Zb(t). As a result, the system generates High Q band pass impedance from low Q baseband impedance. However, impulse response of the High Q bandpass impedances lacks programmability.

Figure 2:
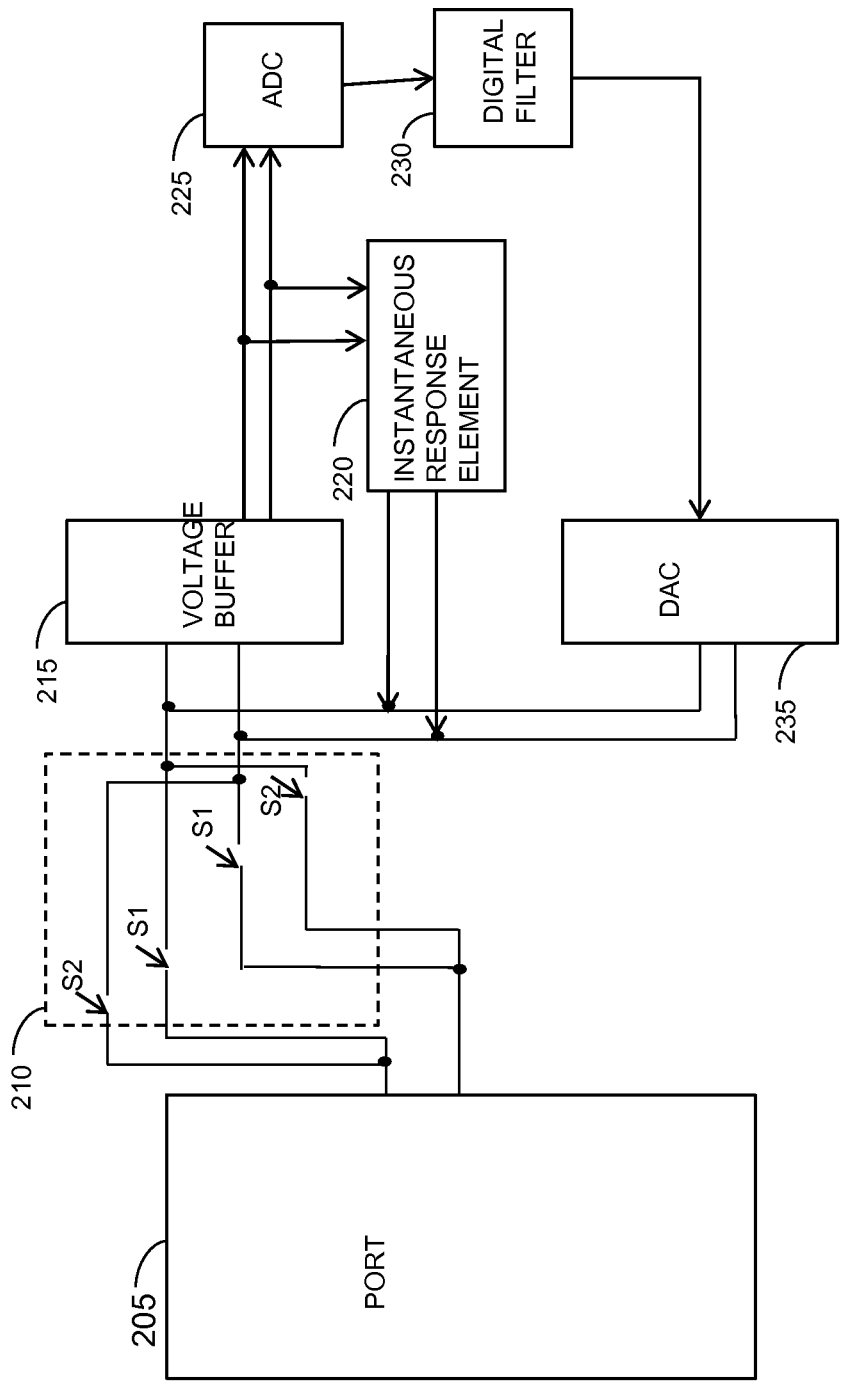
FIG. 2 is a block diagram of a system for synthesizing impedance in a Radio Frequency (RF) amplifier, in accordance with one embodiment of the present invention.

FIG. 2 is a block diagram of a system for synthesizing impedance in a Radio Frequency (RF) amplifier, in accordance with one embodiment of the present invention. The system includes a passive mixer 210, a voltage buffer 215, an instantaneous response element 220, an Analogue to Digital Convertor (ADC) 225, a digital filter 230, and a Digital to Analogue Convertor (DAC) 235. Further, the system includes a port 205. Impedance of the RF amplifier determines frequency response of the RF amplifier. As a result, synthesizing impedance in the RF amplifier alters frequency response of the RF amplifier. Examples of the instantaneous response element 220 include but are not limited to resistors, capacitors, inductors, linear amplifiers, diodes and transistors. The system synthesizes a High Q impedance at the port 205. The port 205 is a part of an RF circuit. Frequency response of the RF circuit depends on the impedance synthesized at the port 205. In one embodiment of the present invention, the RF circuit is at least one of a Low noise amplifier, a Power amplifier, and a pre-power amplifier. The port 205 connects to the voltage buffer 215 via the passive mixer 210.

The passive mixer 210 is a non-linear electronic circuit capable of altering frequency of an electronic signal. Process of altering frequency of an electronic signal from one frequency range to another is referred to as heterodyning. Types of the passive mixer 210 include, but are not limited to unbalanced mixers, balanced mixers, and double balanced mixers. The passive mixer 210 consists of switches S1 and S2. The switches S1 and S2 in the passive mixer 210 senses a voltage signal Vrf across the port 205. The switches S1 and S2 toggles between 'ON' and 'OFF' in accordance with a clock signal from Local Oscillator. It is noted that frequency of the local oscillator determines center frequency of the High Q impedance generated at the port 205. The clock signals received by the switches S1 and S2 are 180 degrees out of phase with each other. Further, the clock signals have a duty cycle of 50%. The switches S1 and S2 down-converts the voltage signal Vrf having radio frequency to baseband voltage signal Vif. Further, the passive mixer 210 feeds the voltage Vif to the voltage buffer 215.

The voltage buffer 215 is a buffer amplifier. The voltage buffer 215 transfers the voltage signal Vif from the passive mixer 210 to the instantaneous response element 220 and the ADC 225. The voltage buffer 215 is necessary to prevent input impedance of the ADC 225 from loading the passive mixer 210. Further, the voltage buffer 215 prevents the ADC 225 from excessively loading the port 205. The voltage buffer 215 is a unity gain amplifier. However, the voltage buffer 215 provides current gain and power gains to the voltage signal Vif. The voltage buffer 215 supplies the voltage signal Vif to the instantaneous response element 220 and the ADC 225.

The ADC 225 converts the voltage signal Vif into a digital signal. Examples of the ADC 225 include but are not limited to a flash ADC, a successive approximation ADC, a ramp-compare ADC, and a Wilkinson ADC. The ADC 225 feeds the digital signal regarding the voltage signal Vif into the digital filter 230.

The digital filter 230 simulates a signal processing component with a desired impulse response. To simulate the signal processing component, the digital filter 230 performs convolution of the digital signal and the desired impulse response. The desired impulse response is impulse response of a low Q baseband impedance filter. As a result, output of the convolution is the digital signal filtered by the low Q baseband filter. The impulse response of the digital filter 230 is programmable. In one embodiment of the present invention, the digital filter 230 is a digital signal processor. In another embodiment of the present invention, the digital filter 230 is at least one of a Field Programmable Gate Array and an Application Specific Integrated circuit. Further, the impulse response and frequency response of the digital filter 230 are programmable. As a result, the digital filter 230 is capable of providing functionality of a plurality of signal processing components. Examples of signal processing components include but are not limited to Finite Impulse Response Filters, Chebyshev Filters, and butterworth filters.

In one embodiment of the present invention, the Digital filter 230 has the impulse response of a low Q baseband filter. In another embodiment of the present invention, the digital filter 230 has the impulse response of a notch filter. In yet another embodiment of the present invention, the digital filter 230 has the impulse response defined by a user. Programmability of the impulse response of the digital filter 230 makes the system flexible and dynamic. Hence, the digital filter 230 performs convolution of the digital signal and the impulse response of the digital filter 230 to generate an output signal. The digital 230 filter supplies the output signal to the DAC 235.

The DAC 235 receives the output signal from the digital filter 230. The DAC 235 generates a baseband current in accordance with the output signal of the digital filter 230. Examples of DAC include but are not limited to Pulse width modulation DACs, delta-sigma DACs, and R2R ladder DACs. The baseband current signal is a current signal having a baseband frequency. The DAC 235, the ADC 225, and the digital filter 230 work in combination to simulate a filter with impulse response equal to the impulse response of the digital filter 230. The DAC 235 supplies the baseband current generated in the DAC 235 to the passive mixer 210.

The digital filter 230 is implemented on a digital signal processor. The digital signal processor requires sufficient amount of processing time to operate. Hence, a combination of the ADC 225, the digital filter 230, and the DAC 235 takes time to process the voltage signal and to simulate the baseband current. Thus, the combination fails to process high frequency voltage signals. Hence, the combination fails to simulate the filter with the desired impulse response for high frequency voltage signals. The instantaneous response element 220 is one of an active component and a passive component. Hence the instantaneous response element 220 takes lesser time than the combination of the ADC 225, the digital filter 230, and the DAC 235 to process the voltage signals and generate the baseband current. Further, the instantaneous response element 220 provides impulse response equal to an approximation of the impulse response of the digital filter 230. Thus, the instantaneous response element 220 processes the voltage signals and generates the baseband current signal.

The passive mixer 210 up-converts the baseband current to radio frequency. Further, the passive mixer 210 supplies the up-converted baseband current into the port 205. As a result, the system synthesizes a High Q band pass impedance at the port 205. The system generates the High Q band pass impedance by performing impedance transformation on the low Q baseband impedance of the digital filter 230. In effect, the system causes the port 205 to act as a High Q impedance with impulse response equal to a frequency translated impulse response of the digital filter 230 and the instantaneous response element 220. Impulse response of the High Q band pass impedance is programmable because of programmability of the digital filter 230. Presence of the High Q band pass impedance in the RF amplifier alters frequency response of the RF amplifier into frequency response of a High Q impedance filter.

Figure 3:
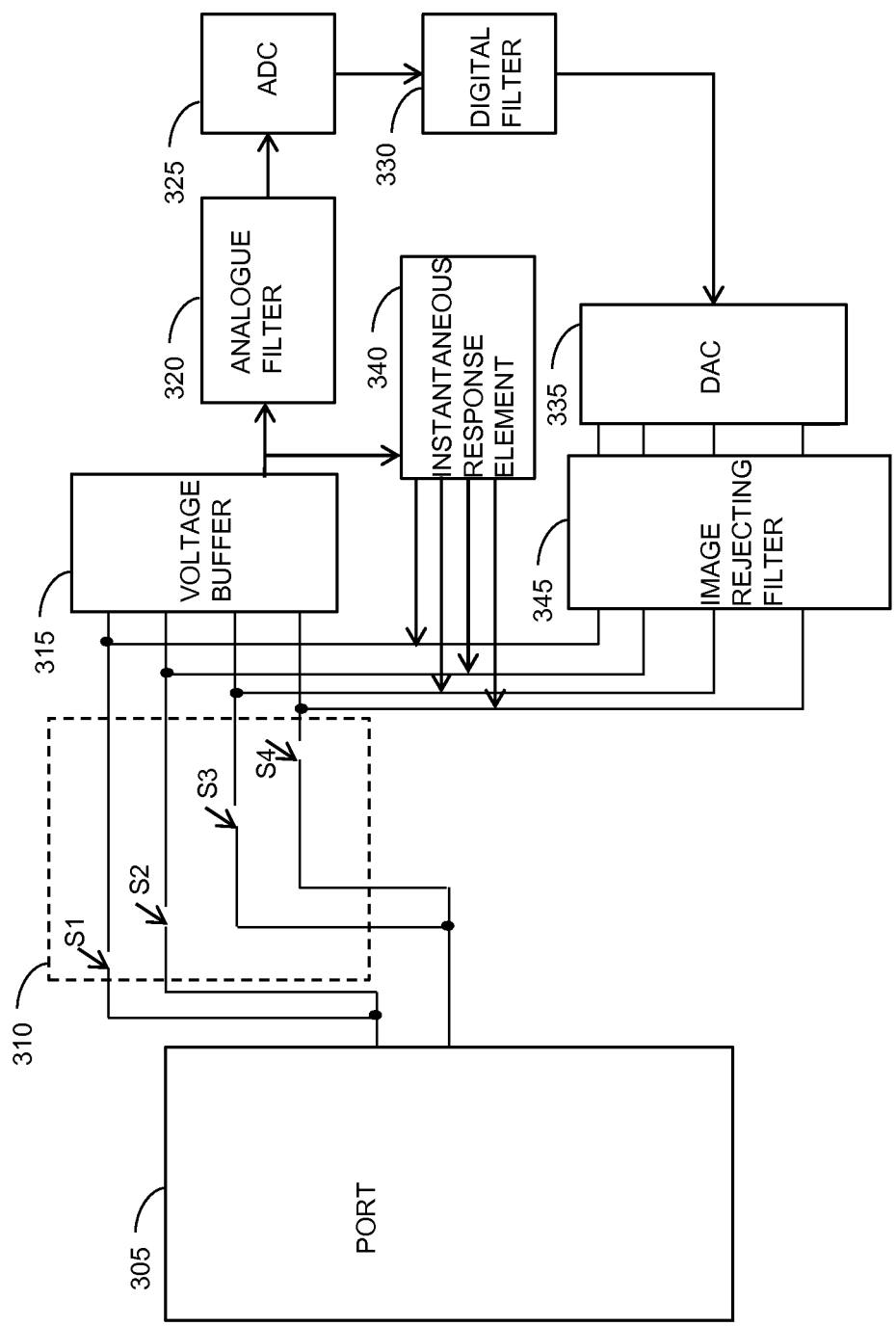
FIG. 3 is a block diagram of a system for synthesizing impedance in a Radio Frequency (RF) amplifier with a quadrature passive mixer, in accordance with another embodiment of the present invention.

FIG. 3 is a block diagram of a system for synthesizing impedance in a Radio Frequency (RF) amplifier with a quadrature passive mixer 310, in accordance with one embodiment of the present invention. The system includes the passive mixer 310, a voltage buffer 315, an analogue filter 320, an Analogue to Digital Convertor (ADC) 325, a digital filter 330, a Digital to Analogue Convertor (DAC) 335, an instantaneous response element 340 and an image rejecting filter 345. Further, the system includes a port 305. Impedance of the RF amplifier determines frequency response of the RF amplifier. As a result, synthesizing impedance in the RF amplifier alters frequency response of the RF amplifier. The system synthesizes a High Q impedance on the port 305. The port 305 is a part of an RF circuit. Frequency response of the RF circuit depends on the impedance synthesized at the port 305. In one embodiment of the present invention, the RF circuit is at least one of a Low noise amplifier, a Power amplifier, and a pre-power amplifier. The port 305 connects to the voltage buffer 315 via the passive mixer 310.

The passive mixer 310 is a non-linear electronic circuit capable of altering frequency of an electronic signal. Process of altering frequency of an electronic signal from one frequency range to another is referred to as heterodyning. The passive mixer 310 consists of a plurality of switches. The plurality of switches include switches S1, S2, S3, and S4. The switches S1, S2, S3, and S4 in the passive mixer 310 senses a voltage signal Vrf across the port 305. The switches S1, S2, S3, and S4 toggles between 'ON' and 'OFF' in accordance with a clock signal from Local Oscillator. It is noted that frequency of the local oscillator determines center frequency of the High Q impedance generated at the port 305. The clock signals received by the switches S1, S2, S3, and S4 are 90 degrees out of phase with each other. Further, the clock signals have a duty cycle of 25%. The switches S1, S2, S3, and S4 down-converts the voltage signal Vrf having radio frequency to baseband voltage signal Vif. Further, the passive mixer 310 feeds the voltage Vif to the voltage buffer 315. The passive mixer 310 provides control over phase response of the High Q impedance generated at the port 305.

The voltage buffer 315 is a buffer amplifier. The voltage buffer 315 transfers the voltage signal Vif from the passive mixer 310 to the analogue filter 320. The voltage buffer 315 is necessary to prevent input impedance of the ADC 325 from loading the passive mixer 310. Further, the voltage buffer 315 prevents the ADC 325 from excessively loading the port 305. The buffer amplifier in the voltage buffer 315 is a unity gain amplifier. However, the voltage buffer 315 provides current gain and power gains to the voltage signal Vif. The voltage buffer 315 supplies the voltage signal Vif to the analogue filter 320.

The analogue filter 320 filters the voltage signal Vif to attenuate undesirable signals from the voltage signal Vif. The analogue filter 320 operates in the frequency range of the voltage signal Vif. The analogue filter 320 attenuates undesirable signals from the voltage signal Vif, and as a result, reduces dynamic range necessary for the ADC 325. Moreover, the analogue filter 320 is an anti-aliasing filter. The analogue filter 320 removes higher order harmonics generated by the local oscillator. Furthermore, the analogue filter 320 reduces sampling frequency required by the ADC 325. The analogue filter 320 supplies the output of the analogue filter 320 to the ADC 325.

The ADC 325 converts the voltage signal Vif into a digital signal. The ADC 325 feeds the digital signal regarding the voltage signal Vif into the digital filter 330.

The digital filter 330 simulates a signal processing component with a desired impulse response. To simulate the signal processing component, the digital filter 330 performs convolution of the digital signal and the desired impulse response. The desired impulse response is impulse response of a low Q baseband impedance filter. As a result, output of the convolution is the digital signal filtered by the low Q baseband filter. The impulse response of the digital filter 330 is programmable.

In one embodiment of the present invention, the digital filter 330 is a digital signal processor. In another embodiment of the present invention, the digital filter 330 is at least one of a Field Programmable Gate Array and an Application Specific Integrated circuit. Further, impulse response and frequency response of the digital filter 330 are programmable. As a result, the digital filter 330 is capable of providing functionality of a plurality of signal processing components. In one embodiment of the present invention, the Digital filter 330 has the impulse response of a low Q baseband filter. In another embodiment of the present invention, the digital filter 330 has the impulse response of a notch filter. In yet another embodiment of the present invention, the digital filter 330 has the impulse response defined by a user. Programmability of the impulse response of the digital filter 330 makes the system flexible and dynamic. Hence, the digital filter 330 performs convolution of the digital signal and the impulse response of the digital filter 330 to generate an output signal. The digital 330 filter supplies the output signal to the DAC 335.

The DAC 335 receives the output signal from the digital filter 330. The DAC 335 generates a baseband current in accordance with the output signal of the digital filter 330. The baseband current signal is a current signal having a baseband frequency. The DAC 335, the ADC 325, and the digital filter 330 work in combination to simulate a filter with impulse response equal to the impulse response of the digital filter 330. The DAC 335 supplies the baseband current generated in the DAC 335 to the passive mixer 310.

The digital filter 330 is implemented on a digital signal processor. The digital signal processor requires sufficient amount of processing time to operate. Hence, a combination of the ADC 325, the digital filter 330, and the DAC 335 takes time to process the voltage signal and to simulate the baseband current. The combination fails to process high frequency voltage signals if the time periods of the voltage signals are smaller than the processing time required by the digital signal processor. Hence, the combination fails to simulate the filter with the desired impulse response for high frequency voltage signals. The instantaneous response element 340 is one of an active component and a passive component. Hence the instantaneous response element 340 takes lesser time than the combination of the ADC 325, the digital filter 330, and the DAC 335 to process the voltage signals and generate the baseband current. Further, the instantaneous response element 340 provides impulse response equal to an approximation of the impulse response of the digital filter 230. Thus, the instantaneous response element 340 processes the voltage signals and generates the baseband current signal. The image rejecting filter 345 filters the baseband current signal to attenuate undesirable signals at image frequencies. Examples of the image rejecting filter 345 include but are not limited to Butterworth filters, Chebyshev filters, and Elliptic filters.

The passive mixer 310 up-converts the baseband current to radio frequency. Further, the passive mixer 310 supplies the up-converted baseband current into the port 305. As a result, the system synthesizes a High Q band pass impedance at the port 305. The system generates the High Q band pass impedance by performing impedance transformation on the low Q baseband impedance of the digital filter 330. In effect, the system causes the port 305 to act as a High Q impedance with impulse response equal to a frequency translated impulse response of the digital filter 330. Impulse response of the High Q band pass impedance is programmable because of programmability of the digital filter 330. Presence of the High Q band pass impedance in the RF amplifier alters frequency response of the RF amplifier into frequency response of the High Q impedance filter.

Figure 4:
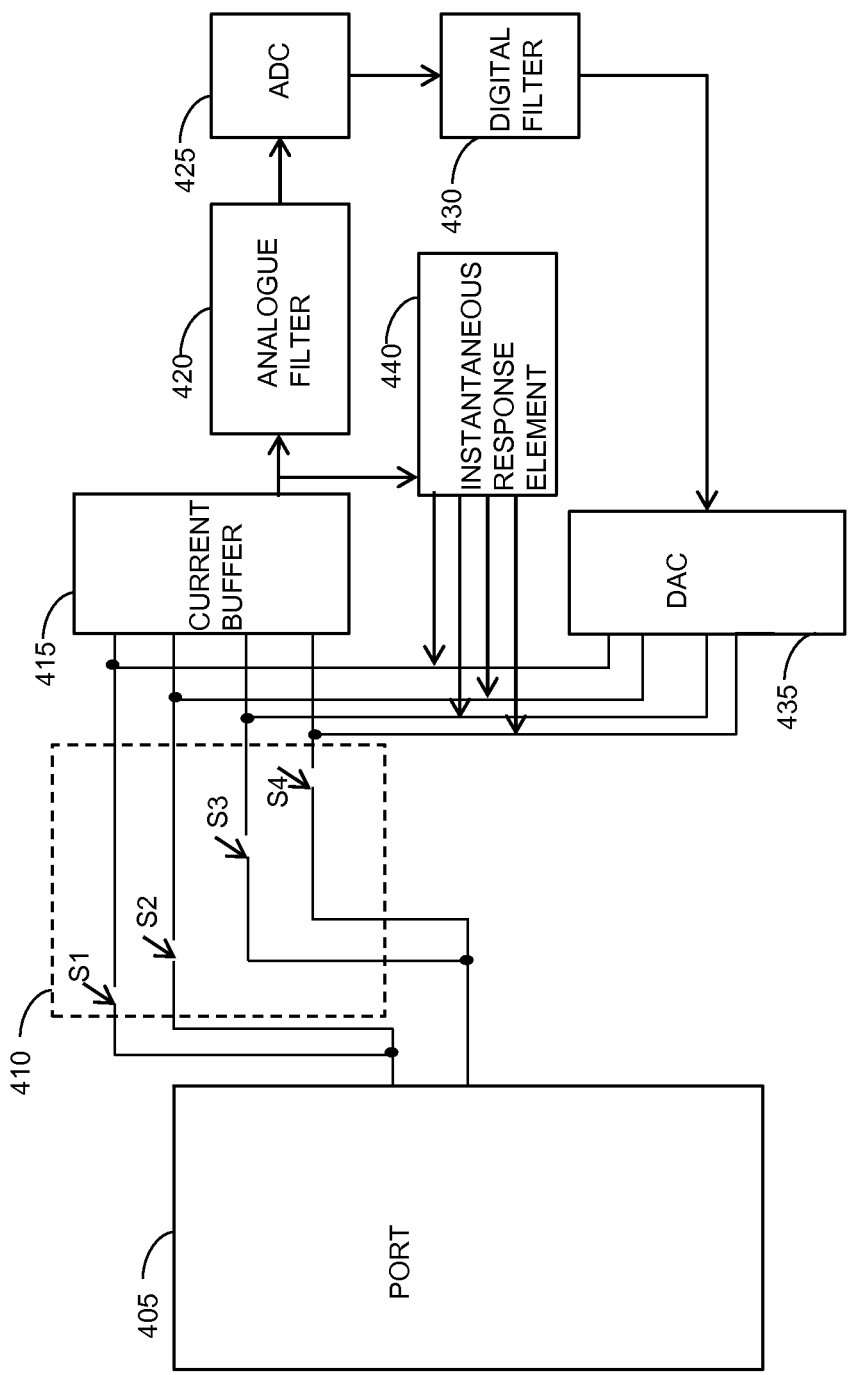
FIG. 4 is a block diagram of a system for synthesizing impedance in a Radio Frequency (RF) amplifier with a quadrature passive mixer, in accordance with yet another embodiment of the present invention.

FIG. 4 is a block diagram of a system for synthesizing impedance in a Radio Frequency (RF) amplifier, in accordance with one embodiment of the present invention. The system includes a passive mixer 410, a current buffer 415, an analogue filter 420, an Analogue to Digital Convertor (ADC) 425, a digital filter 430, a Digital to Analogue Convertor (DAC) 435 and an instantaneous response element 440. The instantaneous response element 440 is one of an active and a passive element. Further, the system includes a port 405. The system synthesizes a High Q impedance on the port 405. The port 405 is a part of an RF circuit. Frequency response of the RF circuit depends on the impedance synthesized at the port 405. In one embodiment of the present invention, the RF circuit is at least one of a Low noise amplifier, a Power amplifier, and a pre-power amplifier. The port 405 connects to the current buffer 415 via the passive mixer 410.

The passive mixer 410 is a non-linear electronic circuit capable of altering frequency of an electronic signal. Process of altering frequency of an electronic signal from one frequency range to another is referred to as heterodyning. Types of the passive mixer 410 include, but are not limited to unbalanced mixers, balanced mixers, and double balanced mixers. The passive mixer 410 consists of switches S1, S2, S3, and S4. The switches S1, S2, S3, and S4 in the passive mixer 410 senses a current signal Irf across the port 405. The switches S1, S2, S3, and S4 toggles between 'ON' and 'OFF' in accordance with a clock signal from Local Oscillator. It is noted that frequency of the local oscillator determines center frequency of the High Q impedance generated at the port 405. The clock signals received by the switches S1, S2, S3, and S4 are 90 degrees out of phase with each other. Further, clock signals have a duty cycle of 25%. The switches S1, S2, S3, and S4 down-converts the current signal Irf having radio frequency to baseband current signal Iif. Further, the passive mixer 410 feeds the current Iif to the current buffer 415. The passive mixer 410 provides control over phase response of the High Q impedance generated at the port 405. In one embodiment of the present invention, the passive mixer 410 consists of a first switch, a second switch, a third switch, a fourth switch, a fifth switch, a sixth switch, a seventh switch, and an eighth switch. The local oscillator feeds each switch in the passive mixer 410 with a clocking signal with a duty cycle of 12.5%. The clock signals received by the switches the first switch, the second switch, the third switch, the fourth switch, the fifth switch, the sixth switch, the seventh switch, and the eighth switch are 45 degrees out of phase with each other. In another embodiment of the present invention, the passive mixer 410 includes one or more switches.

The current buffer 415 is a buffer amplifier. The current buffer 415 transfers the current signal Iif from the passive mixer 410 to the analogue filter 420. The current buffer 415 is necessary to prevent input impedance of ADC 425 from loading the passive mixer 410. Further, the current buffer 415 prevents the ADC 425 from excessively loading the port 405. The current buffer 415 is a unity gain amplifier. However, the current buffer 415 provides voltage gain and power gains to the current signal Iif. The current buffer 415 supplies the current signal Iif to the analogue filter 420.

The analogue filter 420 filters the current signal Iif to attenuate undesirable signals from the current signal Iif. The analogue filter 420 operates in the frequency range of the current signal Iif. The analogue filter 420 attenuates undesirable signals from the current signal Iif, and as a result, reduces dynamic range necessary for the ADC 425. Moreover, the analogue filter 420 is an anti-aliasing filter. The analogue filter 420 removes higher order harmonics generated by the local oscillator. Furthermore, the analogue filter 420 reduces sampling frequency required by the ADC 425. Furthermore, the analogue filter 420 reduces sampling frequency required by the ADC 425. The analogue filter 420 supplies the output of the Analogue filter 420 to the ADC 425.

The ADC 425 converts the current signal Iif into a digital signal. The ADC 425 feeds the digital signal regarding the current signal Iif into the digital filter 430.

The digital filter 430 simulates a signal processing component with a desired impulse response. To simulate the signal processing component, the digital filter 430 performs convolution of the digital signal and the desired impulse response. The desired impulse response is impulse response of a low Q baseband impedance filter. As a result, output of the convolution is the digital signal filtered by the low Q baseband filter. The impulse response of the digital filter 430 is programmable. Further, impulse response and the frequency response of the digital filter 430 are programmable. As a result, the digital filter 430 is capable of providing functionality of a plurality of signal processing components. In one embodiment of the present invention, the Digital filter 430 has the impulse response of a low Q baseband filter. In another embodiment of the present invention, the digital filter 430 has the impulse response of a notch filter. In yet another embodiment of the present invention, the digital filter 430 has the impulse response defined by a user. Programmability of the impulse response of the digital filter 430 makes the system flexible and dynamic. Hence, the digital filter 430 performs convolution of the digital signal and the impulse response of the digital filter 430 to generate an output signal. The digital 430 filter supplies the output signal to the DAC 435.

The DAC 435 receives the output signal from the digital filter 430. The DAC 435 generates a baseband voltage signal in accordance with the output signal of the digital filter 430. The baseband voltage signal is a voltage signal having a baseband frequency. The DAC 435, the ADC 425, and the digital filter 430 work in combination to simulate a filter with impulse response equal to the impulse response of the digital filter 430. The DAC 435 supplies the baseband voltage signal to the passive mixer 410.

The digital filter 430, is implemented on a digital signal processor. The digital signal processor requires sufficient amount of processing time to operate. Hence, a combination of the ADC 425, the digital filter 430, and the DAC 435 takes time to process the current signal Iif and to simulate the baseband voltage. The combination fails to process high frequency current signals if the time periods of the current signals are smaller than the processing time required by the digital signal processor. Hence, the combination fails to simulate the filter with the desired impulse response for high frequency current signals. The instantaneous response element 440 is one of an active component and a passive component. Hence the instantaneous response element 440 takes lesser time than the combination of the ADC 425, the digital filter 430, and the DAC 435 to process the current signals and generate the baseband voltage. Further, the instantaneous response element 440 provides impulse response equal to an approximation of the impulse response of the digital filter 430. Thus, the instantaneous response element 440 processes the current signals and generates the baseband voltage signal.

The passive mixer 410 up-converts the baseband voltage to radio frequency. Further, the passive mixer 410 supplies the up-converted baseband voltage into the port 405. As a result, the system synthesizes a High Q band pass impedance at the port 405. The system generates the High Q band pass impedance by performing impedance transformation on the low Q baseband impedance of the digital filter 430. In effect, the system causes the port 405 to act as a High Q impedance with impulse response equal to a frequency translated impulse response of the digital filter 430. Impulse response of the High Q band pass impedance is programmable because of programmability of the digital filter 430. Presence of the High Q band pass impedance in the RF amplifier alters frequency response of the RF amplifier into frequency response of the High Q impedance filter.

Figure 5:
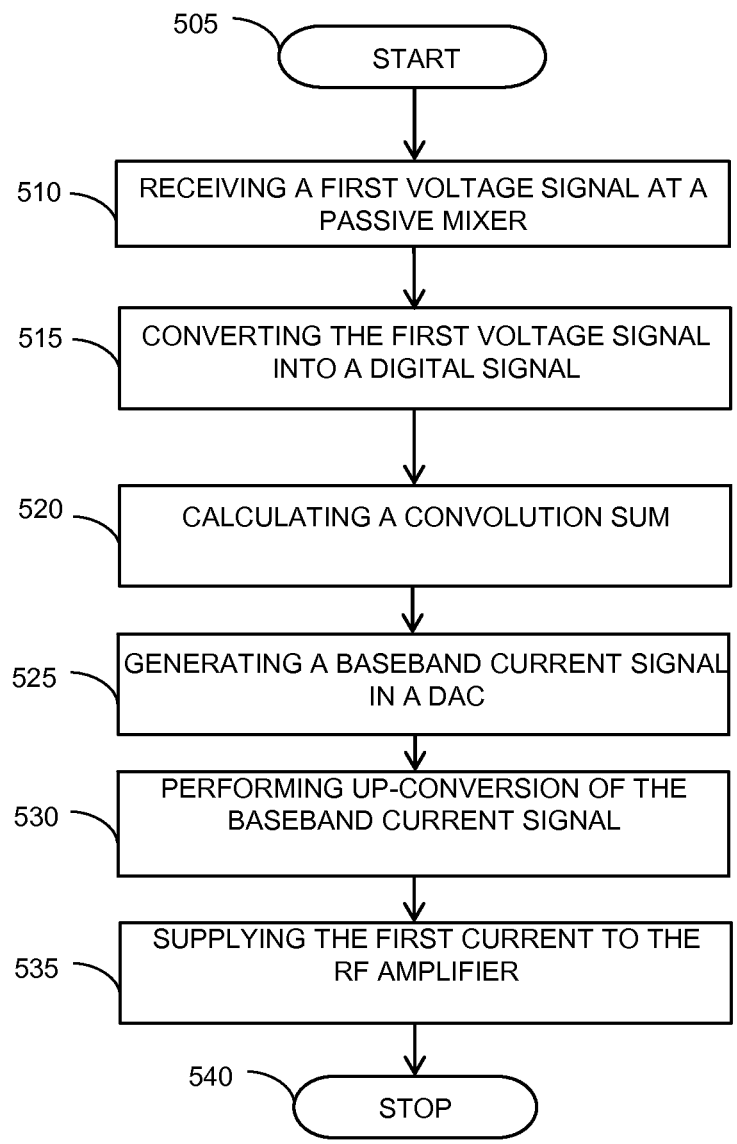
FIG. 5 is a flowchart of method for synthesizing impedance in a Radio Frequency (RF) amplifier, in accordance with one embodiment of the present invention.

FIG. 5 is a flowchart of method for synthesizing impedance in a Radio Frequency (RF) amplifier, in accordance with one embodiment of the present invention. Impedance of the RF amplifier determines frequency response of the RF amplifier. As a result, synthesizing impedance in the RF amplifier alters frequency response of the RF amplifier. A process illustrated by the flowchart begins at step 505.

At step 510, a passive mixer receives a first voltage signal across the impedance component. The passive mixer consists of switches S1 and S2. The switches S1 and S2 in the passive mixer senses a voltage signal Vrf across the impedance component. The switches S1 and S2 down-converts the voltage signal Vrf having radio frequency to voltage signal Vif having a baseband frequency.

At step 515, an Analogue to Digital convertor (ADC) converts the voltage signal Vif into a digital signal. The ADC feeds the digital signal regarding the voltage signal Vif into the digital filter.

At step 520, a digital filter performs convolution of the digital signal and an impulse response of the digital filter. In one embodiment of the present invention, the digital filter is a digital signal processor. In another embodiment of the present invention, the digital filter is at least one of a Field Programmable Gate Array and an Application Specific Integrated circuit. The impulse response of the digital filter is programmable. The digital filter simulates a low Q baseband impedance filter in the system. Further, the digital filter performs convolution of the digital signal and an impulse response of the digital filter to generate an output signal. The digital filter supplies the output signal to a Digital to Analogue converter (DAC).

At step 525, the DAC generates a baseband current signal in accordance with the output signal of the digital filter. The baseband current signal is a current signal having baseband frequency. The DAC supplies the baseband current generated in the DAC to the passive mixer.

At step 530, the passive mixer up-converts the baseband current to radio frequency. As a result, the system synthesizes a High Q band pass impedance on the RF impedance. The system generates the High Q band pass impedance by performing impedance transformation of the low Q baseband impedance of the digital filter. In effect, the system causes the port to act as a filter with impulse response equal to a frequency translated impulse response of the digital filter.

At step 535, the passive mixer supplies the up-converted baseband current to the RF amplifier, thereby synthesizing a desired impedance in the RF amplifier and in turn a desired a frequency response in the RF amplifier.

The process ends at step 540.

Advantageously, the embodiments specified in the present disclosure provide a method of synthesizing impedance in a Radio Frequency amplifier. The proposed invention enables alteration of frequency response to an optimum value of the RF amplifier by synthesizing impedance in the RF amplifier. The proposed invention reduces use of active components in the RF amplifier and as a result, the proposed invention avoids addition to noise figure caused by the active components. The proposed invention enables in reduction of chip size of integrated circuit implementation of the RF amplifier by eliminating the use of bulky SAW filters.

In the preceding specification, the present disclosure and its advantages have been described with reference to the specific embodiments. However, it will be apparent to a person with ordinary skill in the art that various modifications and changes can be made, without departing from the scope of the present disclosure, as set forth in the claims below. Accordingly, the specification and figures are to be regarded as illustrative examples of the present disclosure, rather than in restrictive sense. All such possible modifications are intended to be included within the scope of present disclosure.

What is claimed is:

1. A method of synthesizing impedance in a radio frequency (RF) amplifier, the method comprising:
    receiving a voltage signal in a passive mixer, wherein the passive mixer down-converts the voltage signal into a baseband frequency;
    converting the voltage signal into a digital signal;
    performing convolution of the digital signal with an impulse response using a digital filter to generate an output signal, wherein the output signal is a filtered digital signal, wherein the digital filter is implemented by digital signal processing;
    programming the digital filter to generate a programmable baseband impedance, wherein the digital filter performs functionalities of a plurality of signal processing components;
    generating a first current signal based on the output signal of the convolution at a digital to analog converter, wherein the current signal comprises a baseband frequency;
    generating a second current signal using an instantaneous response element by processing the voltage signal, wherein the instantaneous response element is an active component, wherein the instantaneous response element reduces time to process the voltage signal and generates the second current signal, wherein the second current signal is provided to the first current signal;
    performing up-conversion of the first current signal in the passive mixer, wherein the passive mixer performs impedance transformation of the baseband impedance; and
    providing the up-converted first current signal to a port to synthesize a desired impedance in the RF amplifier, thereby controlling frequency response of the RF amplifier, wherein the desired impedance in the RF amplifier alters frequency response of the RF amplifier into a frequency response of a high Q impedance filter, wherein a center frequency of the frequency response of the high Q impedance filter is programmable based on the digital filter.

2. The method as claimed in claim 1, wherein the RF amplifier is at least one of a low noise amplifier, a power amplifier device, and a pre-power amplifier.

3. The method as claimed in claim 1, wherein the desired impedance is dependent on local oscillator frequency of the passive mixer.

4. A system for synthesizing impedance in a radio frequency (RF) amplifier, the system comprising:
    a passive mixer, wherein the passive mixer is operable to receive a voltage signal, and
        perform down-conversion of the voltage signal into a baseband frequency;
    an analogue to digital converter to convert the voltage signal into a digital signal;
    a digital filter to perform convolution of the digital signal with an impulse response to generate an output signal, wherein the output signal is a filtered digital signal, wherein the digital filter is a low Q baseband filter, wherein the digital filter is implemented by digital signal processing, wherein the digital filter is programmable to generate a programmable baseband impedance, wherein the digital filter performs functionalities of a plurality of signal processing components;
    a digital to analogue converter to generate a first current signal based on the output signal of the convolution, wherein the baseband current signal comprises a baseband frequency; and
    an instantaneous response element generates a second current signal by processing the voltage signal, wherein the instantaneous response element is an active component, wherein the instantaneous response element reduces time to process the voltage signal and generates the second current signal, wherein the second current signal is provided to the first current signal, wherein the passive mixer up-converts the first current signal in the passive mixer, wherein the passive mixer performs impedance transformation of the baseband impedance, wherein the up-converted first current signal is provided to a port to synthesize a desired impedance in the RF amplifier, thereby controlling frequency response of the RF amplifier.

5. The system as claimed in claim 4, wherein the desired impedance in the RF amplifier alters frequency response of the RF amplifier into a frequency response of a high Q impedance filter, wherein a center frequency of the frequency response of the high Q impedance filter is programmable based on the digital filter.

6. The system as claimed in claim 5, wherein the desired impedance is dependent on local oscillator frequency of the passive mixer.

7. The system as claimed in claim 6, wherein the passive mixer comprises a first switch and a second switch driven with clocking signals 180 degrees out of phase with each other.

8. The system as claimed in claim 4, wherein the passive mixer performs Impedance transformation of the baseband impedance.

9. The system as claimed in claim 4, wherein the RF amplifier is at least one of a low noise amplifier, a power amplifier device, and a pre-power amplifier.

10. The system as claimed in claim 4, wherein the digital filter is implemented as at least one of a Digital Signal Processor, a Field Programmable Gate Array, and an Application Specific Integrated Chip.

11. A system for synthesizing impedance in a radio frequency (RF) amplifier, the system comprising:
    a passive mixer, wherein the passive mixer is operable to receive a voltage signal, and
        perform down-conversion of the voltage signal into a baseband frequency;
    an analogue to digital converter to convert the voltage signal into a digital signal;
    a digital filter to perform convolution of the digital signal with an impulse response to generate an output signal, wherein the output signal is a filtered digital signal, wherein the digital filter is a low Q baseband filter, wherein the digital filter is implemented by digital signal processing, wherein the digital filter is programmable to generate a programmable baseband impedance, wherein the digital filter performs functionalities of a plurality of signal processing components;

a digital to analogue converter to generate a first current signal based on the output signal of the convolution, wherein the baseband current signal comprises a baseband frequency;

an image rejecting filter to attenuate image frequency components from the first current signal; and an instantaneous response element generates a second current signal by processing the voltage signal, wherein the instantaneous response element is an active component, wherein the instantaneous response element reduces time to process the voltage signal and generates the second current signal, wherein the second current signal is provided to the first current signal, wherein the passive mixer up-converts the first current signal in the passive mixer, wherein the passive mixer performs impedance transformation of the baseband impedance, wherein the up-converted first current signal is provided to a port to synthesize a desired impedance in the RF amplifier, thereby controlling frequency response of the RF amplifier, wherein the desired impedance in the RF amplifier alters frequency response of the RF amplifier into frequency response of a high Q impedance filter, wherein a center frequency of the frequency response of the high Q impedance filter is programmable based on the digital filter.

12. The system as claimed in claim 11, wherein the desired impedance is dependent on local oscillator frequency of the passive mixer.

13. The system as claimed in claim 11, wherein the passive mixer comprises a first switch, a second switch, a third switch, and a fourth switch to down-convert the voltage signal Vrf comprising radio frequency to a baseband voltage signal.

14. The system as claimed in claim 13, wherein the local oscillator feeds gates of the first switch, the second switch, the third switch, and the fourth switch with clocking signals 90degrees out of phase with each other.

15. The system as claimed in claim 14, wherein the clocking signals have a duty cycle of 25%.

\* \* \* \* \*